United States Patent [19]
Stross

[11] 3,747,045
[45] July 17, 1973

[54] LEAD LOCKING CONFIGURATION FOR ELECTRICAL COMPONENTS

[75] Inventor: Hans A. Stross, Kennebunk, Maine

[73] Assignee: Sprague Electric Company, North Adams, Mass.

[22] Filed: Apr. 19, 1971

[21] Appl. No.: 135,259

[52] U.S. Cl. ....... 339/17 C, 174/68.5, 317/101 CC, 339/252 P, 339/275 B
[51] Int. Cl. .......... H05k 1/18
[58] Field of Search ............ 339/17 R, 17 M, 17 C, 339/18 R, 18 C, 18 P, 31, 32, 33, 66, 65, 144, 149, 147 R, 147 C, 198, 217, 218, 219, 220, 221, 252 R, 256 S, 275 B, 276 C, 278 A, 252 P; 317/101 C, 101 CC; 174/68.5

[56] References Cited

UNITED STATES PATENTS

| | | | |
|---|---|---|---|
| 2,902,629 | 9/1959 | Little et al. | 339/17 C |
| 3,517,374 | 6/1970 | Bonhomme | 339/252 P |
| 1,141,841 | 6/1915 | Shumate | 292/87 |
| 3,534,248 | 10/1970 | Houda, Jr. et al. | 317/10 CC X |
| 2,942,332 | 6/1960 | Wright et al. | 317/101 CC X |

*Primary Examiner*—Marvin A. Champion
*Assistant Examiner*—Terrell P. Lewis
*Attorney*—Connolly & Hutz and Vincent H. Sweeney

[57] ABSTRACT

The lead configuration of an electrical component is such that one of the leads locks into position in an aperture of a wiring board when the unit is inserted therein with nominal pressure. This configuration allows the unit to slide only so far into the aperture before it locks in place, thereby prohibiting the unit from being inserted any further, or from falling out of position if the board were inverted. These units remain locked in an upright position on the wiring board for the purpose of being further secured thereon, as by wave soldering.

6 Claims, 5 Drawing Figures

LEAD LOCKING CONFIGURATION FOR ELECTRICAL COMPONENTS

BACKGROUND OF THE INVENTION

This invention relates to a lead locking configuration for electrical components, and more particularly to lead configurations for mounting and locking capacitors into printed wiring boards.

In attaching electrical components onto printed circuits, apertures are formed in the boards on which the circuit is printed. The components must be properly positioned in and on the printed boards to provide for the proper assembly of the circuit. The components must extend sufficiently into the board perforations and yet not extend too far therein. The leads must give the mounting of the capacitor on the printed board stability, and at the same time not extend so far into the board as to the point of bringing the capacitor cover coating into contact with the printed circuit. The general procedure is to assemble the separate components to the circuit board in a one-by-one fashion, and after all are assembled thereto, a soldering operation is generally performed to firmly fix the components on the board, as well as to make the desired electrical connections.

Some problems encountered in assembling components to a circuit board prior to and during the soldering operation include: having lead wires of the components slip all the way through the apertures on the board, thereby causing the coating on the component to come in direct contact with the wiring board; having components become dislodged from the board while other components are being inserted; having components accidently placed on the board in the wrong polarity arrangement; and having components move or become tilted when solder is applied thereto. Prior art attempts at overcoming these and other attendant problems have not been entirely successful.

Accordingly, it is an object of the present invention to provide a lead arrangement for the attachment of an electrical component to a circuit board that will lock in place upon insertion into the proper aperture thereon, and that will only go into the board to a particular predetermined depth.

It is a further object of this invention to provide a lead configuration of an electrical component that prevents insertion of the component into the board in the wrong polarity position.

It is a still further object of this invention to provide an electrical component that can be attached onto a circuit board in an upright position in such a manner that subsequent soldering operations will not move or tilt the component.

SUMMARY OF THE INVENTION

An electrical component, such as a polar solid-electrolyte capacitor, has one of its lead wires bent in such a fashion that the lead locks in an aperture of a wiring board firmly at a predetermined depth and in an upright position upon being inserted therein with nominal pressure or force.

The capacitor is to be plugged into a printed wiring board that has apertures for each polarity - negative and positive. These apertures are of different diameters, for example, 0.080 inch and 0.040 inch. The lead wire that has been bent in the manner prescribed by this invention takes on a shape or configuration that will effectively prevent it from being inserted in the smaller diameter aperture, thereby insuring the proper polarity arrangement of the component on the board.

The lead configuration is formed by bending a straight portion of the lead wire through approximately 150° inwardly up toward the upper portion of the wire in a plane parallel to the plane of the two lead wires. The wire is then bent again at the end or outermost portion of the wire through approximately 70° so as to cross back over the upper and unbent portion of the wire, thereby forming a semi-triangular configuration. The wire lead having this configuration is originally approximately twice the length as the other lead wire which is not bent at all, so that after the bend is completed thereon, both wires are of the same length. When the unit is attached to the board it will stand evenly, and will be locked into position.

DESCRIPTION OF THE PREFERRED EMBODIMENT

Figure 1:
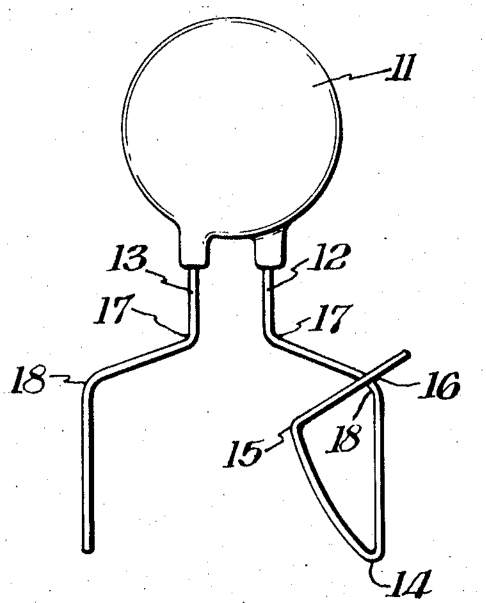
FIG. 1 is a front elevational view of a capacitor with leads embodying this invention.
Figure 2:
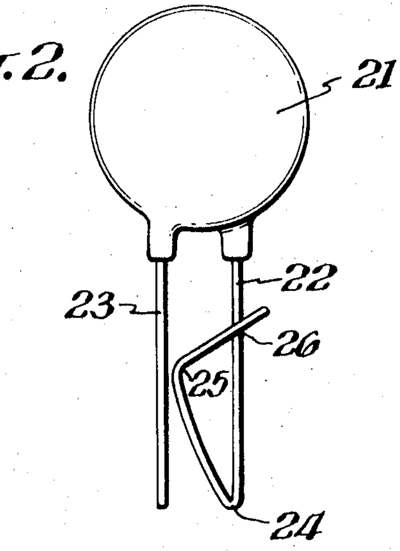
FIG. 2 is a front elevational view of another capacitor, also having leads embodying this invention.

The leads of an electrical component of this invention position, stabilize and lock the component into apertures formed in printed circuit boards. The particular lead configuration that permits this can be demonstrated best by reference to the drawings. In FIG. 1, there is shown a capacitor unit 11 encapsulated in epoxy resin, and having two tinned nickel wire leads 12 and 13 extending therefrom. Lead wire 13 extends down from the capacitor to point 17 where an angle bend of approximately 90° is made away from the other lead wire 12, then at point 18 the lead wire is bent back so as to be substantially parallel to its original track. Lead wire 12 extends down from the capacitor in the same manner as does lead wire 13, through bends at 17 and 18; however, lead wire 12 is substantially longer than lead wire 13, and bends back up through an angle of approximately 150° at 14 whereby the length of lead wire 12 is the same as lead 13, and then a final bend at 15 is made so as to just cross the end of wire 12 back over the upper part of the lead wire between points 17 and 18, usually closer to 18, at point 16. It is not necessary to have the bends at 17 and 18 prior to forming the semi-triangular formation that acutally encompasses this invention. In FIG. 2, substantially straight lead wires 22 and 23 extend from an epoxy encapsulated capacitor 21 without the preliminary bends 17, 18 shown in FIG. 1, which are put in for easier mounting of the smaller capacitor unit 11. A first lead wire 23 remains substantially straight, while a second lead wire 22, which is substantially longer than the first wire 23, is bent inward through approximately 150° at point 24. Point 24 is determined by the length of the first lead wire 23. The bend on the second lead wire 22 will be at a point on the wire that is equal to the length of said first lead wire 23. The second lead wire 22 is then bent again at 25 through an angle of approximately 70° so as to just cross over the upper portion of lead wire 22 at point 26, thereby forming the semi-triangular shape characteristic of the lead configuration of this invention.

Figure 3:
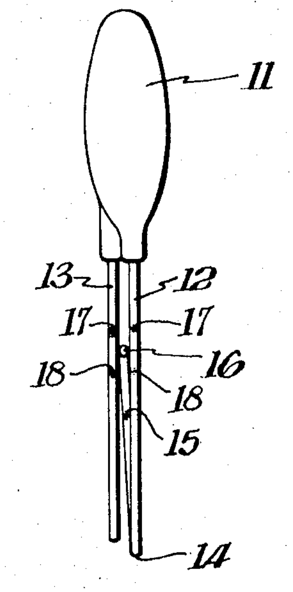
FIG. 3 is a side elevational view of the capacitor of FIG. 1.

FIG. 3 shows a side view of FIG. 1, wherein the encapsulated capacitor 11 has lead wires 12 and 13 extending therefrom in a plane parallel to each other. It should be noted that the semi-triangular configuration formed on lead 12 follows the path of leads 12 and 13, crossing lead wire 12 at point 16. It is also demonstrated herein that lead wires 12 and 13 are of approximately the same length after the configuration of this invention is formed. The lead wires of FIG. 2 would look substantially the same if observed from a side view.

Figure 4:
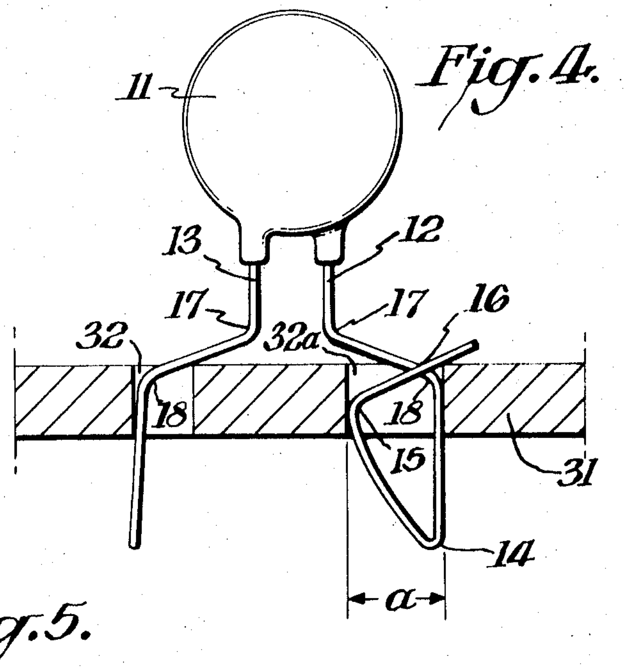
FIG. 4 shows the capacitor of FIG. 1 inserted into a printed wiring board.

FIG. 4 shows the capacitor of FIG. 1 inserted into a printed wiring board 31 through holes 32 and 32*a*. The cathode lead 13 is inserted in the cathode aperture 32 of 0.040 inch diameter, and the anode lead wire 12 bearing the lead configuration of this invention is inserted into the anode aperture 32*a* of 0.080 inch diameter. The anode lead 12 as shown in FIG. 1 bears the lead configuration that is this invention, and when in the free or non-inserted state has a diameter "*a*", as shown in FIG. 4, of 0.105 inch, and when inserted into aperture 32*a* the configuration has a diameter of 0.080 inch insuring that the unit is locked into the board. The diameter of lead wires 12 and 13 could be 0.020 inch or 0.025 inch; although they could be larger diameter for insertion into larger apertures. Because of the size of the shaped lead 12, it is impossible to insert it into the smaller aperture 32, thereby insuring that the capacitors are inserted according to the right polarity.

It can be concluded that this invention comprises bending inwardly through an angle of approximately 150° the anode lead wire of an electrical component that is substantially longer than the cahtode wire, said bend being at a point that is equal in length to the cathode wire, and then bending the end of this wire back through an angle of approximately 70° so as to cause the end of the wire to just cross over the upper portion of this wire, forming a semi-triangular configuration thereon. The first or unbent lead wire having a definite length and being substantially straight.

Units having this lead configuration will be locked in position when inserted into an aperture of a wiring board with nominal pressure or force. The wiring board will have two apertures of different polarity for each capacitor to be inserted therein, one for the positive lead wire and one for the negative lead wire. Generally, these apertures will be of different diameters, for example, the cathode aperture will have a diameter of 0.040 inch, and the anode aperture will have a diameter of 0.080 inch. In this example, a capacitor such as shown in FIG. 4 of the drawings, has lead wires of 0.020 inch diameter. After the lead configuration has been formed on the anode lead, this lead wire will only fit into the larger anode aperture, assuring that the unit is polarized correctly on the board. Upon insertion into the proper aperture, the unit will lock into place firmly, so as to prevent rocking or tilting, and will remain in an upright position throughout subsequent operations.

This configuration prohibits not only the insertion of this bent lead into the wrong aperture, but also prohibits either lead from being inserted so far into the board as to bring the epoxy coating into contact with the board because of the locking characteristic of the lead wires of the present invention. If an attempt is made to push the unit with more than the nominal force or pressure necessary to cause the lock to take place, then the unit will break before a faulty insertion takes place. This configuration also dispenses with the need of having to twist the lead wire onto the board with a tool after insertion.

The size of the bend in the wire is determined by the size of the apertures in the wiring board. The diameter across the lead wire configuration at its widest point 15, 25 should be at least approximately 0.018 inch wider than the aperture itself when dealing with apertures such as mentioned earlier. For example, an electrical component having a lead configuraiton whose diameter is 0.100 inch across would lock into an aperture of 0.080 inch. However, when the apertures are substantially larger, then the diameter of the configuration should be proportionately wider.

Figure 5:
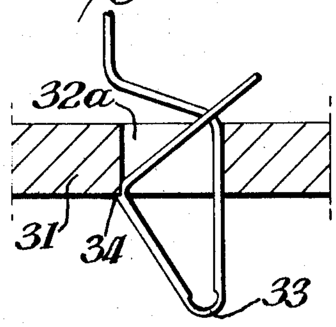
FIG. 5 is a front elevational view of another embodiment of the lead configuration of this invention.

Another embodiment of the present invention which would lock the unit into the board more positively is shown in FIG. 5. The lead configuration is swaged in the bend area 33 to facilitate formability, allowing for the smallest bend radius, and a small notch is taken on the wire at 34 to insure that the unit locks into place. The notch should be formed or cut in a manner that allows the unit to fit snugly into the lower corner of an aperture in a printed circuit board.

The invention can be utilized on any electrical component that has wire leads that are to be inserted into apertures on a printed wiring board. While tinned nickel wires are used as leads in the examples herein, any malleable, solderable and conductive wire can be used as a lead wire for the purposes of this invention.

This invention provides a means for mounting electrical components in printed circuit boards that is economical, because the units are locked in place simply by inserting them into the aperture, and no further fastening procedure need be performed, prior to soldering. This eliminates steps from prior art methods, thereby facilitating the whole operation.

The above-described specific embodiments of the invention have been set forth for the purposes of illustration. It will be apparent to those skilled in the art that various modifications may be made in the formed lead structure without departing from the principles of this invention as pointed out and disclosed herein. For that reason, it is not intended that the invention should be limited other than by the scope of the appended claims.

What is clamed is:

1. A lead configuration for an electrical component that mounts and locks in a printed circuit board aperture comprising an electrical component having at least one lead wire extending therefrom, said lead wire at a point spaced from said component having a first bend upwardly back toward said component through an angle of approximately 150° to a point where a second bend through an angle of approximately 70° causes the end portion of the wire to cross over the upper portion of said lead wire, thereby forming a generally triangular configuration which is substantially wider at said second bend than the width of an aperture in a printed circuit board to provide a locking action therein.

2. The lead configuration of claim 1 wherein said component has a second substantially straight and shorter lead wire extending thereform; said first bend being at a point that is substantially equal to the length of said second lead wire.

3. The lead configuration of claim 2 wherein said second lead wire has a bend outward from said at least one lead wire through an angle of approximately 90°, and then a bend back so as to follow its original track and to be approximately parallel therewith; and said at least one lead wire has a preliminary bend outward through an angle of approximately 90°, and then a bend back so as to follow its original track and to be substantially parallel therewith above said first and said second bends thereon.

4. The lead configuration of claim 2 wherein said at least one lead wire is swaged in the area that has said first bend through an angle of approximately 150°, and said at least one lead wire has a small notch at said second bend of approximately 70°, said notch being of a shape that will fit into the lower corner of an aperture in a printed circuit board.

5. The lead configuration of claim 2 wherein said at least one lead wire is an anode lead wire for said component; and said second lead wire is a cathode lead wire of said component.

6.The lead configuration of claim 5 wherein the diameter across said lead configuration of said anode lead wire at its widest point is at least approximately 0.0180 inch wider than an anode aperture on a printed circuit board into which said configuration is inserted, said cathode lead wire being inserted into a cathode aperture on said printed board that is narrower than said anode aperture.

* * * * *